(12) United States Patent
Goebel et al.

(10) Patent No.: US 6,376,313 B1
(45) Date of Patent: Apr. 23, 2002

(54) INTEGRATED CIRCUIT HAVING AT LEAST TWO VERTICAL MOS TRANSISTORS AND METHOD FOR MANUFACTURING SAME

(75) Inventors: Bernd Goebel; Emmerich Bertagnolli, both of Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/079,020

(22) Filed: May 14, 1998

(30) Foreign Application Priority Data

May 14, 1997 (DE) .......................................... 197 20 193

(51) Int. Cl.[7] .......................................... H01L 21/336
(52) U.S. Cl. ...................... 438/270; 438/259; 257/330; 257/332; 257/371
(58) Field of Search ................................ 257/330, 332; 438/259, 270

(56) References Cited

U.S. PATENT DOCUMENTS

| | | | |
|---|---|---|---|
| 4,630,088 A | | 12/1986 | Ogura et al. ............... 357/23.6 |
| 4,990,979 A | * | 2/1991 | Otto ............................. 357/23.5 |
| 5,302,846 A | * | 4/1994 | Matsumoto .................. 257/329 |
| 5,327,374 A | * | 7/1994 | Krautschneider et al. ... 365/145 |
| 5,376,575 A | | 12/1994 | Kim et al. ..................... 437/52 |
| 5,471,417 A | * | 11/1995 | Krautschneider et al. ... 365/145 |
| 5,675,161 A | * | 10/1997 | Thomas ....................... 257/316 |
| 5,937,283 A | * | 8/1999 | Lee .............................. 438/149 |
| 5,981,995 A | * | 11/1999 | Selcuk ......................... 257/330 |
| 5,998,263 A | * | 12/1999 | Sekariapuram et al. ..... 438/259 |

FOREIGN PATENT DOCUMENTS

DE    38 44 120 C2    7/1989

OTHER PUBLICATIONS

Gray et al., Analysis and Design of Analog Integrated Circuits, 3rd edition, pp. 532, (1993).*
Hodges et al., Analysis and Design of Digital Integrated Circuits, 2nd edition, pp. 25–29 (1988).*

* cited by examiner

Primary Examiner—Long Pham
Assistant Examiner—Scott Braiton
(74) Attorney, Agent, or Firm—Schiff Hardin & Waite

(57) ABSTRACT

An integrated circuit having at least two vertical MOS transistors, and method for manufacturing same, wherein first source/drain regions of the two vertical MOS transistors are located in an upper region of sidewalls of a trench. A second source/drain region is shared by both MOS transistors and is adjacent a floor of the trench. Gate electrodes of the MOS transistors that are arranged at the sidewalls of the trench can be individually contacted via parts of a conductive layer that are arranged above the first source/drain regions. In a manufacturing method, such arrangement is made possible by the deposition of a conductive layer of doped polysilicon before the generation of the trench. The area of an MOS transistor can amount to $4F^2$.

4 Claims, 3 Drawing Sheets

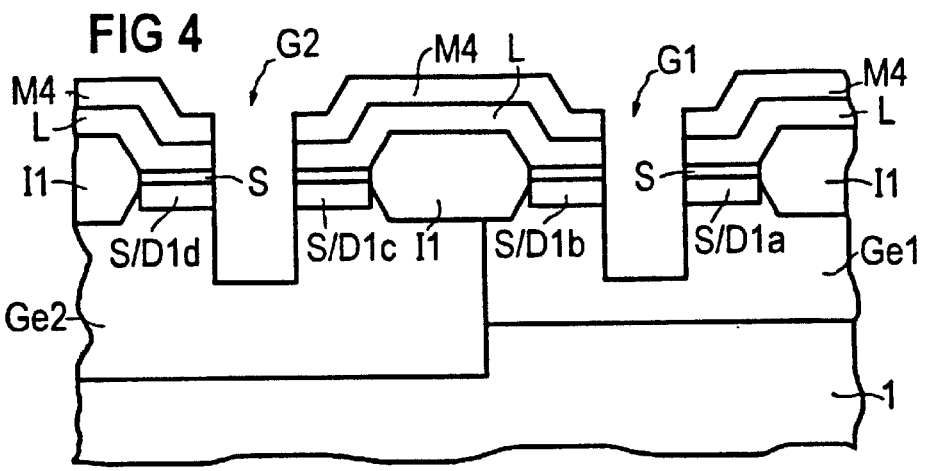
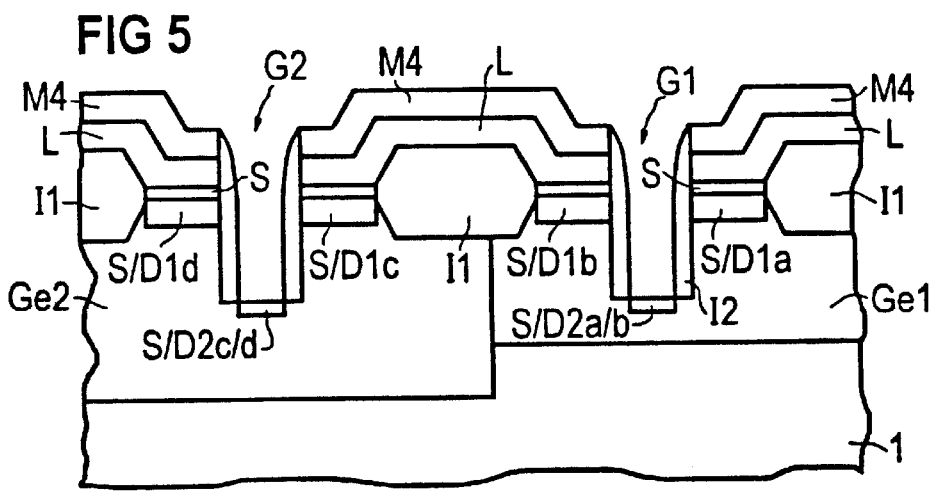
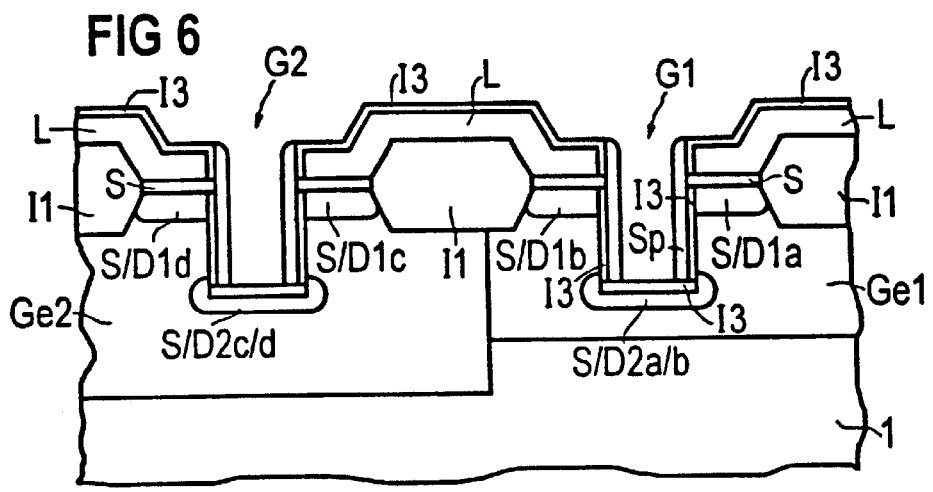

INTEGRATED CIRCUIT HAVING AT LEAST TWO VERTICAL MOS TRANSISTORS AND METHOD FOR MANUFACTURING SAME

BACKGROUND OF THE INVENTION

1. Field of the Invention

The present invention is generally directed to integrated circuits that require individually controllable MOS transistors.

2. Description of the Prior Art

An increased packing density as well as a shortening of the connections between components are desirable in the development of new integrated circuits. This is typically accomplished using planar silicon technology.

A diminution of the areas of MOS transistors can be achieved, for example, with a vertical, instead of a horizontal, channel course. An earlier German Letters Patent proposed a vertical MOS transistor whose source and drain regions are arranged laterally and in differing depth. The channel thereof proceeds substantially perpendicularly relative to the surface of the circuit along the sidewalls of a depression. The MOS transistor is surrounded by an insulation structure. The saving in area per transistor amounts to approximately $4F^2$ compared to the area of planar transistors. At approximately $16F^2$, however, the area of this vertical MOS transistor continues to be large.

U.S. Pat. No. 5,376,575 disclosed the employment of vertical MOS transistors for DRAM cell arrangements; i.e., memory cell arrangements having dynamic random access. Each vertical MOS transistor in the disclosed manufacturing method includes two oppositely residing sidewalls of a trench situated in a substrate. First doped regions that act as first source/drain regions of the MOS transistor are provided in the upper region of the sidewalls. Second doped regions that act as second source/drain regions are arranged under the first source/drain regions. Second source/drain regions of MOS transistors neighboring along the trench are connected to one another via a bit line. Surfaces of the sidewalls are provided with a gate oxide. A gate electrode that covers surfaces of the gate oxides lying opposite one another is provided for the MOS transistor. Shallow trenches are provided in the substrate which proceed transversely relative to bit lines, and word lines proceed transversely to the bit lines arranged therein. The word lines are laterally adjacent to gate electrodes and are thus connected thereto. Gate electrodes of MOS transistors neighboring along a word line are connected to one another via the word line. The smallest area of a memory cell obtainable with this method amounts to $6F^2$. What is disadvantageous about vertical MOS transistors of this type is that they can only be employed for circuit arrangements wherein the gate electrodes of the MOS transistors are connected to one another. The MOS transistors cannot be individually driven.

SUMMARY OF THE INVENTION

The present invention is directed toward an integrated circuit having MOS transistors that can be individually driven and which can occupy a relatively small area as well as a manufacturing method for such a circuit.

In an embodiment of the present invention, a first MOS transistor is adjacent to a first sidewall of a trench and a second MOS transistor is adjacent to a second sidewall of the trench lying opposite the first sidewall. The first MOS transistor and the second MOS transistor lie opposite one another. First source/drain regions of the two MOS transistors are located in the upper region of the sidewalls. A second source/drain region is divided by the two MOS transistors and is adjacent to a floor of the trench. The sidewalls of the trench are provided with a gate dielectric. The gate electrodes of the MOS transistor are arranged in the trench at the sidewalls of the trench. The gate electrodes can be individually driven via parts of a conductive layer that are arranged above the first source/drain regions.

An inventive MOS transistor can be manufactured with an area of $4F^2$. It is important for the manufacturing method that a conductive layer is produced before generation of the trench. The gate electrodes can be individually contacted via parts of the conductive layer.

The present invention offers the advantage that the MOS transistors can be individually driven. Such MOS transistors can thus be employed, for example, for radio-frequency circuit arrangements or for inverters. It is within the scope of the present invention to have more than two MOS transistors at a trench for manufacturing large circuit arrangements with enhanced packing density. It is also within the scope of the present invention to generate a plurality of trenches arranged parallel to each other at which MOS transistors are formed for manufacturing large circuit arrangements with enhanced packing density.

It is further within the scope of the present invention that vertical transistors of a first trench are complimentary to vertical transistors of a second trench. Also, the present invention contemplates generating a doped, well-shaped first region by implantation in which the first trench is generated and a doped, well-shaped second region in which the second trench is generated. In this case, it is advantageous to employ a first mask for the implantation of the first region that subsequently serves as mask for producing a second mask which is employed in the implantation of the second region.

It is advantageous to employ structured layers that contain silicon nitride as masks when insulating structures are produced by thermal oxidation since such masks are heat-resistant and impermeable for oxidants.

Additional features and advantages of the present invention are described in, and will be apparent from, the Detailed Description of the Preferred Embodiments and from the Drawings.

DESCRIPTION OF THE DRAWINGS

FIG. 4 shows the first substrate after a first insulating layer, a layer of doped polysilicon, a second insulating layer as well as a first trench and a second trench have been produced. First source/drain regions were thereby defined.

FIG. 5 shows the first substrate after the generation of both a second source/drain region and a third source/drain region with the assistance of a second insulating structure $SiO_2$.

FIG. 6 shows the first substrate after the generation of a third insulating layer and after the generation of spacers of doped polysilicon.

DETAILED DESCRIPTION OF THE PREFERRED EMBODIMENTS

Figure 2:
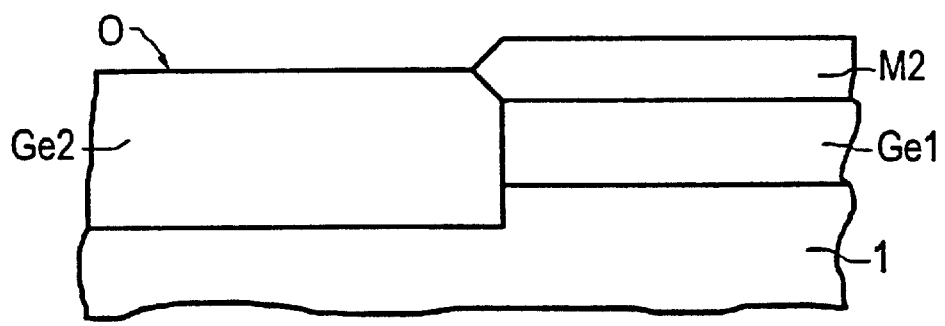
FIG. 2 shows the first substrate after a second mask was formed with the assistance of the first mask and after a doped, second region was produced with the assistance of the second mask.

According to a first embodiment, a first substrate 1 is a semiconductor wafer that contains silicon at a surface O. An n-doped first region Ge1 and a p-doped second region Ge2 are generated at the surface O by implantation such that they laterally adjoin one another (see FIG. 2). The dopant concentration of the first region Ge1 amounts to approximately $10^{17}$ cm$^{-3}$. The dopant concentration of the second region Ge2 amounts to approximately $10^{17}$ cm$^{-3}$. The first region Ge1 and the second region Ge2 will include channel regions of four MOS transistors yet to be produced.

Figure 1:
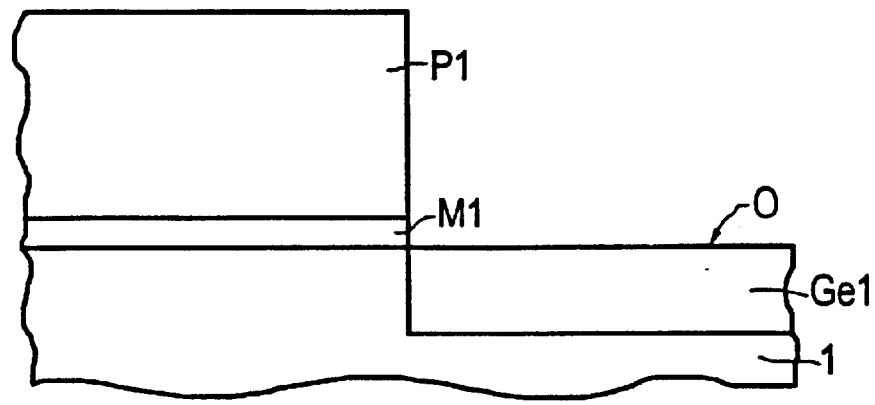
FIG. 1 shows a first substrate after a first mask, a first photoresist mask as well as a doped, first region have been produced as the surface of the substrate.

So that the first region Ge1 and the second region Ge2 laterally adjoin one another to increase the packing density, silicon nitride having a thickness of approximately 150 nm is deposited on the surface O before they are generated. Silicon nitride is etched with the assistance of a first photoresist mask P1 that is produced by a photolithographic method, as a result whereof a first mask M1 having the same shape as the first photoresist mask P1 is formed and which is more heat-resistant than the first photoresist mask P1 (see FIG. 1). A mixture of $O_2$ and $SF_6$ is suitable as etchant. The first photoresist mask P1 also serves as a mask in the subsequent generation of the first region Ge1 by implantation (see FIG. 1).

The first photoresist mask P1 is subsequently removed. A second mask M2 (see FIG. 2) is formed at the surface O above the first region Ge1 by thermal oxidation with the assistance of the first mask M1 that is heat-resistant and impermeable to oxidants. As a result, the first mask M1 adjoins the second mask M2. The thickness of the second mask M2 amounts to approximately 400 nm.

Subsequently, silicon nitride is selectively etched to $SiO_2$, for example with $H_3PO_4$, as a result whereof the first mask M1 is removed. The second region Ge2 is generated by implantation, whereby the second mask M2 serves as a mask (see FIG. 2). Since the first mask M1 adjoined the second mask M2, the first region Ge1 adjoins the second region Ge2. Subsequently, $SiO_2$ is selectively etched relative to silicon such that the second mask M2 is removed. HF, for example, is suitable as etchant.

Figure 3:
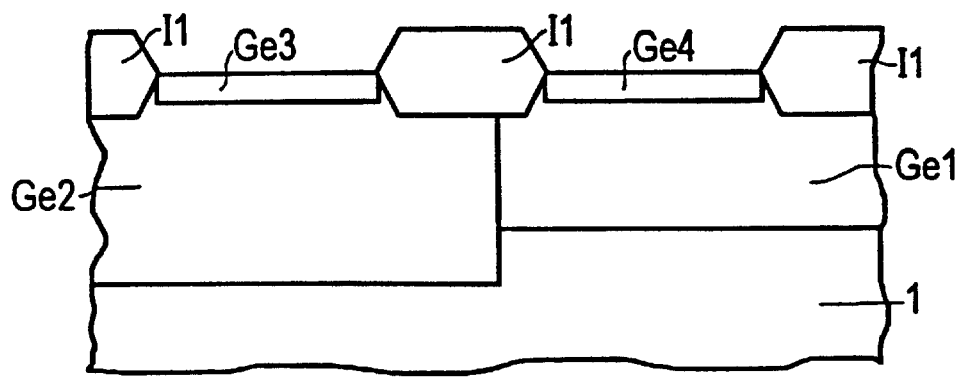
FIG. 3 shows the first substrate after a first insulating structure, a doped, third region and a doped, fourth region were produced. The first insulating structure separates the third region from the fourth region.

A first insulating structure I1 that encompasses boundary regions between the first region Ge1 and the second region Ge2 is formed by thermal oxidation with the assistance of a third mask (not shown) of silicon nitride that does not cover boundary regions between the first region Ge1 and the second region Ge2 and that is produced—analogous to the first mask M1—with the assistance of a second photoresist mask (not shown) having the same shape as the third mask (see FIG. 3). Subsequently, the third mask is removed by etching. The first insulating structure I1 will separate a first source/drain region S/D1b (yet to be produced) of a second MOS transistor formed in the first region Ge1 from a first source/drain region S/D1c (yet to be produced) of a third MOS transistor in the second region Ge2.

A third region Ge3 that is n-doped (see FIG. 3) is generated at the surface O in the second region Ge2 by implantation with the assistance of a third photoresist mask (not shown) that covers at least the first region Ge1. A fourth region Ge4 that is p-doped (see FIG. 3) is generated by implantation within the first region Ge1 with the assistance of a fourth photoresist mask (not shown) that covers at least the second region Ge2. The first source/drain regions S/D1a, S/D1b, S/D1c, S/D1d of the four MOS transistors arise from the third region Ge3 and the fourth region Ge4.

An insulating layer S having a thickness of approximately 50 nm (see FIG. 4) is generated at the surface O by, for example, thermal oxidation. The insulating layer S will contribute to the electrical insulation of the first source/drain regions S/D1a, S/D1c, S/D1d of the four MOS transistors from gate electrodes Ga1, Ga2, Ga3, Ga4 of the four MOS transistors to be generated. Subsequently, a conductive layer L of doped polysilicon is deposited. The conductive layer L will serve for the contacting of the gate electrodes Ga1, Ga2, Ga3, Ga4, wherein such contacting is generated above the first source/drain regions S/D1a, S/D1b, S/D1c, S/D1d.

A fourth mask M4 of $SiO_2$ having a thickness of approximately 200 nm is generated over the conductive layer L in that $SiO_2$ is deposited and subsequently structured with the assistance of a fifth photoresist mask (not shown). The fourth mask M4 covers at least the insulating structure I1. Subsequently, a first trench G1 which parts each of the conductive layer L, the insulating layer S and the fourth region Ge4 and which extends into the first region Ge1, and a second trench G2 which parts each of the conductive layer L, the insulating layer S and the third region Ge3 and which extends into the second region Ge2 are generated (see FIG. 2). This occurs with the assistance of the fourth mask M4, whereby the doped polysilicon, $SiO_2$ and silicon are anisotropically etched. The first trench G1 and the second trench G2 proceed substantially parallel and exhibit a depth of approximately 600 nm from the surface O, a width of approximately 500 nm and a length of approximately 100 μm. The fourth region Ge4 is divided by the first trench G1 into the first source/drain region S/Da of the first MOS transistor and into the first source/drain region S/D1b of the second MOS transistor. The third region Ge3 is divided by the second trench G2 into the first source/drain region S/D1c of the third MOS transistor and into the first source/drain region S/D1d of the fourth MOS transistor.

Subsequently, $SiO_2$ is conformally deposited in a TEOS method and is anisotropically re-etched, as a result whereof a second insulating structure I2 is formed that covers sidewalls of the first trench G1 and of the second trench G2 in the form of spacers. A p-doped, second source/drain region S/D2a/b that belongs to both the first MOS transistor and the second MOS transistor is generated by implantation at the floor of the first trench G1 with the assistance of a sixth photoresist mask (not shown) that covers at least the second region Ge2 but not the first trench G1 (see FIG. 5). An n-doped second source/drain region S/D2c/d that belongs to the third MOS transistor and to the fourth MOS transistor is generated by implantation (see FIG. 5) at the floor of the second trench G2 with the assistance of a seventh photoresist mask (not shown) that covers at least the first region Ge1 but not the second trench G2. The second insulating structure I2 thereby serves as mask, as a result whereof the lateral expanse of the p-doped second source/drain region S/D2a/b and the lateral expanse of the n-doped second source/drain region S/D2c/d are kept small. Due to the second insulating structure I2, moreover, the sidewalls of the first trench G1 and of the second trench G2 are protected against implantation. Subsequently, $SiO_2$ is selectively etched relative to silicon, as a result whereof the second insulating structure I2 and the fourth mask M4 are removed.

For producing a gate dielectric Gd, a third insulating structure I3 is generated by thermal oxidation (see FIG. 6). The third insulating structure I3 is especially thick at the floors of the first trench G1 and of the second trench G2 since highly doped silicon oxidizes more highly at temperatures below 900° C. than doped polysilicon or lightly doped silicon. The thickness of the insulating structure I3 amounts to approximately 15 nm at the sidewalls of the first trench G1 and of the second trench G2. Doped polysilicon having a thickness of approximately 50 nm is deposited thereover. The doped polysilicon is anisotropically re-etched so that only spacers Sp (see FIG. 6) remain at the sidewalls of the first trench G1 and of the second trench G2. By isotropic etching of $SiO_2$ selectively to doped polysilicon, the third insulating structure I3 is structured such that it covers only the floors and the sidewalls of the first trench G1 and of the second trench G2 (see FIG. 7). The conductive layer L is thus uncovered. A part of the third insulating structure I3 at the sidewalls of the first trench G1 and of the second trench G2 is protected by the spacers Sp during this etching step and serves as gate dielectric Gd. A part of the third insulating structure I3 of the floors of the first trench G1 and of the second trench G2 will insulate the p-doped, second source/drain region S/D2a/b and of the n-doped second source/drain region S/D2c/d from the gate electrodes Ga1, Ga2, Ga3, Ga4 to be produced for the four MOS transistors to be produced.

For forming the gate electrodes Ga1, Ga2, Ga3, Ga4, conductive material is deposited and anisotropically re-etched, so that the gate electrodes Ga1, Ga2, Ga3, Ga4 arise at the sidewalls of the first trench G1 and of the second trench G2 in the form of spacers and are connected to the conductive layer L.

Figure 7:
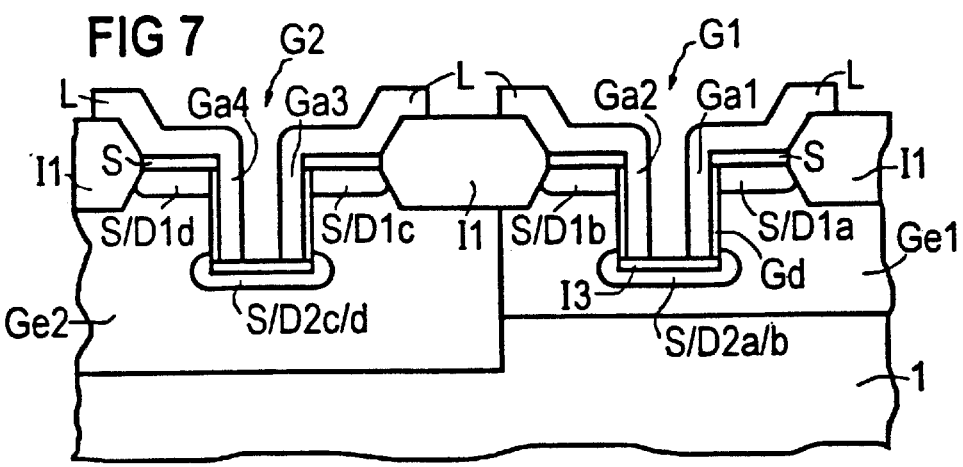
FIG. 7 shows the first substrate after a gate dielectric was formed from the third insulating layer and gate electrodes were generated and insulated from one another.

With the assistance of a seventh photoresist mask (not shown) that covers regions above the first insulation structure I1, a gate electrode Ga2 of the second MOS transistor is insulated from a gate electrode Ga3 of the third MOS transistor (see FIG. 7). The four MOS transistors are formed in this way. Their channels proceed along the sidewalls of the first trench G1 and of the second trench G2. It is thus a matter of vertical transistors. The gate electrodes Ga1, Ga2, Ga3, Ga4 are individually driveable.

Figure 8:
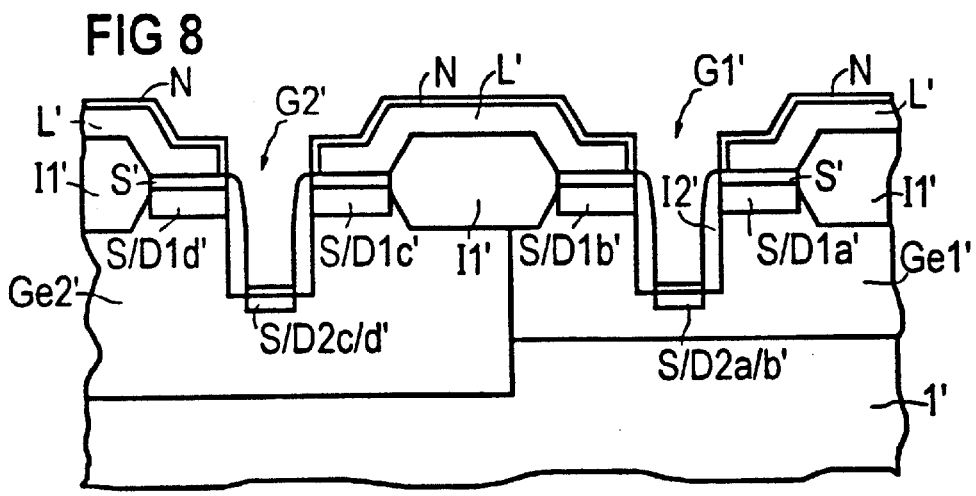
FIG. 8 shows a second substrate after a first trench, a second trench, a first region, a second region, first source/drain regions, a second source/drain region, a third source/drain region, a first insulating structure, a second insulating structure, a layer of doped polysilicon and a second insulating structure were generated analogous to FIG. 5 and a structure of silicon nitride was generated.
Figure 9:
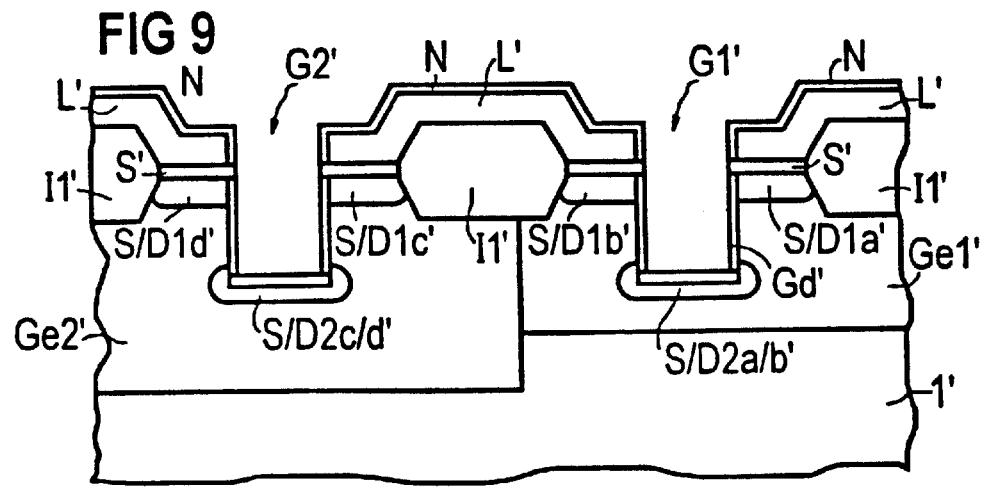
FIG. 9 shows the second substrate after a gate dielectric was generated.

In a second exemplary embodiment, a second substrate 1' that contains a first trench G1', a second trench G2', a structured, first region Ge1', a structured, second region Ge2', for first source/drain regions S/D1a/', S/D1b', S/D1c', S/D1d', two second source/drain regions S/D2a/b', S/Dc/d' a first insulating structure I1', a second insulating structure I2', a layer of doped polysilicon L' and a fourth mask (not shown) is provided analogous to the first exemplary embodiment, wherein the second substrate I' contains silicon at a surface O'. The fourth mask is removed by anisotropic etching of $SiO_2$ and the second insulating structure I2' is etched back until sidewalls of the layer of doped polysilicon L' are uncovered. Subsequently, silicon nitride is grown surface-wide. Silicon nitride thereby grows more thickly on the conductive material than on $SiO_2$. As a result of isotropic etching of silicon nitride, a structure N of silicon nitride (see FIG. 8) remains only at the sidewalls and on a surface of the layer of doped polysilicon L'. The second insulating structure I2' is removed by isotropic etching with, for example, HF. A third insulating structure I3' is generated by thermal oxidation, whereby the structure N of silicon nitride protects the layer of doped polysilicon L' (see FIG. 9). The third insulating structure I3' at sidewalls of the first trench G1' and of the second trench G2' serves as gate dielectric Gd'. The structure N of silicon nitride is then removed in an etching step. Subsequently, gate electrodes Ga1' Ga2', Ga3', Ga4' are generated, analogous to the first exemplary embodiment.

Many variations of the exemplary embodiments described herein are within the contemplation and scope of the present invention. In particular, the dimensions of the described layers, regions and trenches can be adapted to the respective requirements. The same is also true of the proposed dopant concentrations. Structures and layers of $SiO_2$ can, in particular, be produced by thermal oxidation or by a deposition method. Instead of employing $SiO_2$ as material of the gate dielectric, the employment of other dielectrics is also conceivable, such as, for example, silicon nitride, $Al_2O_3$ or $TaO_5$. The dielectric can also be composed of three sub-layers. In this case, a lower sub-layer and an upper sub-layer contain $SiO_2$ and a middle sub-layer contains silicon nitride. Polysilicon can be doped both during and after the deposition. Instead of polysilicon, metal silicides and/or metals can be employed. The first insulating structure can also be formed as trenches filled with $SiO_2$.

Although the present invention has been described with reference to specific embodiments, those of skill in the art will recognize that changes may be made thereto without departing from the spirit and scope of the invention as set forth in the hereafter appended claims.

We claim as our invention:

1. An integrated circuit formed in a substrate of semiconductor material, the integrated circuit having at least two vertical MOS transistors and comprising:
   a trench formed in the substrate having a sidewall lying opposite a second sidewall wherein the first and second sidewalls are provided with a gate dielectric;
   a first MOS transistor having a first source/drain region adjacent an upper region of the first sidewall of the trench;
   a second MOS transistor having a first source/drain region adjacent an upper region of the second sidewall of the trench wherein the second MOS transistor lies opposite the first MOS transistor;
   a second source/drain region formed partly of both the first MOS transistor and the second MOS transistor, the second source/drain region adjacent a floor of the trench and having a floor insulating material formed thereon;
   a first gate electrode of the first MOS transistor formed along the first sidewall of the trench, wherein the first gate electrode is insulated from the second source/drain region via the floor insulating material;
   a second gate electrode of the second MOS transistor formed along the second sidewall of the trench, wherein the second gate electrode is insulated from the second source/drain region via the floor insulating material, and wherein the second and first gate electrodes are not electrically connected; and
   a conductive layer formed above the first source/drain regions of the first and second MOS transistors, wherein parts of the conductive layer are respectively contacted with the first and second gate electrodes such that the first and second gate electrodes may be individually driven.

2. An integrated circuit as claimed in claim 1, wherein a plurality of MOS transistors are formed along the first and second sidewalls of the trench, and wherein second source/drain regions of adjacent MOS transisitors along one of the first and second sidewalls are electrically connected.

3. An integrated circuit as claimed in claim 1, wherein a plurality of vertical MOS transistors are formed along a plurality of trenches.

4. An Integrated circuit as claimed in claim 3, wherein a plurality of vertical MOS transistors formed along a first trench are complementary to a plurality of vertical MOS transistors formed along a second trench.

* * * * *